(12) United States Patent
Tripathi et al.

(10) Patent No.: US 7,307,492 B2
(45) Date of Patent: Dec. 11, 2007

(54) DESIGN, LAYOUT AND METHOD OF MANUFACTURE FOR A CIRCUIT THAT TAPS A DIFFERENTIAL SIGNAL

(75) Inventors: Alok Tripathi, Beaverton, OR (US); Dennis J. Miller, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 425 days.

(21) Appl. No.: 10/306,418

(22) Filed: Nov. 27, 2002

(65) Prior Publication Data

US 2004/0103383 A1    May 27, 2004

(51) Int. Cl.
*H01P 5/00* (2006.01)
*H01P 5/18* (2006.01)
*G06F 17/50* (2006.01)

(52) U.S. Cl. .................... 333/111; 333/113; 333/115; 716/1

(58) Field of Classification Search ............. 716/8, 716/1, 4; 333/111, 113, 115
See application file for complete search history.

(56) References Cited

U.S. PATENT DOCUMENTS

| | | | |
|---|---|---|---|
| 2,786,980 A * | 3/1957 | Crowley-Milling | 333/113 |
| 2,794,958 A * | 6/1957 | Walter | 333/115 |
| 3,283,266 A * | 11/1966 | Leo et al. | 333/113 |
| 4,700,152 A | 10/1987 | Wilson | |
| 6,150,898 A * | 11/2000 | Kushitani et al. | 333/110 |
| 6,408,427 B1 * | 6/2002 | Cong et al. | 716/13 |
| 6,897,739 B2 * | 5/2005 | Chan et al. | 333/127 |
| 6,900,756 B2 * | 5/2005 | Salmon | 342/351 |
| 2002/0093384 A1 | 7/2002 | Woods et al. | |
| 2003/0030506 A1 | 2/2003 | Dawn et al. | |
| 2003/0214364 A1 * | 11/2003 | Cites et al. | 333/33 |
| 2006/0077392 A1 * | 4/2006 | Hebert et al. | 356/446 |

FOREIGN PATENT DOCUMENTS

GB    2 345 583 A    7/2000

(Continued)

OTHER PUBLICATIONS

Takeuchi, K., et al., "Instantaneous image observation of ultrafast electrical pulse propagating on metal strip", pp. 29-32, Dec. 3, 1996, Microwave Photonics, Technical Digest. XP010270484.

(Continued)

*Primary Examiner*—Stacy A Whitmore
(74) *Attorney, Agent, or Firm*—Blakely, Sokoloff, Taylor & Zafman LLP (57) ABSTRACT

An apparatus that includes a first conducting strip having a narrowed width where the first conducting strip also acts as a first electrode for a first tapping capacitance. The first tapping capacitance has a second electrode that is: 1) parallel to the first conducting strip; and 2) closer to the first conducting strip than a second conducting strip. The second conducting strip is parallel to the first conducting strip and has a narrowed width where the second conducting strip also acts as a first electrode for a second tapping capacitance. The second tapping capacitance has a second electrode that is: 1) parallel to the second conducting strip; and 2) closer to the second conducting strip than the first conducting strip.

16 Claims, 8 Drawing Sheets

FOREIGN PATENT DOCUMENTS

JP          03064221          3/1991
JP          04000802          1/1992

OTHER PUBLICATIONS

Murata MFG. Co. Ltd., "Directional Coupler", European Patent Office, Patent Abstracts of Japan, 1 page, Publication No. 10126117, Publication Date May 15, 1998.

Linner, L.J.P., et al., "Stripline Bandpass Filter With Variable Physical Dimensions", pp. 339-343, Proceedings of the European Microwave Conference, Paris Sep. 4-8, 1978. XP002161073.

Heyen, J., et al., "Vertical Feedthrouhs for Millimetere-Wave LTCC Modules", pp. 411-414, 33rd European microwave Conference, Munich 2003.

Korean Office Action mailed Jul. 29, 2006 (2 pages, translation provided); Copy of claims as they now stand in the Korean Patent Office showing amendments before the Korean Examiner (9 pages.).

Chinese Office Action mailed Feb. 25, 2005 (4 pages, translation provided); Notice of Allowance mailed Sep. 25, 2005 (2 pages, translation provided) and Copy of the claims as they as issued from the Chinese Patent Office showing amendments made before the Chinese Examiner (9 pages).

European Office Actions mailed Nov. 21, 2005 (7 pages); Jun. 23, 2006 (3 pages); Feb. 26, 2007 (7 pages) together with Applicant's responses to action of Nov. 21, 2006 (11 pages); to action of Jun. 23, 2006 (13 pages); to action of Feb. 26, 2007 (13 pages).

Summary of Foreign Counterpart Activity (1 page) May 23, 2007.

Patent Abstract of Japan of JP03064221, Mar. 19, 1991, (1 page).

European Office Action faxed Jun. 18, 2007 (1 pages) together with Enclosure JP03064221 (6 pages), Abstract of JP03064221 (1 page) and Claim 1 (1 page).

Summary of Foreign Counterpart Activity (1 page) Jun. 21, 2007.

\* cited by examiner

DESIGN, LAYOUT AND METHOD OF MANUFACTURE FOR A CIRCUIT THAT TAPS A DIFFERENTIAL SIGNAL

FIELD OF INVENTION

The Field of Invention relates to electronic circuitry, generally; and, more specifically, to the design, layout and method of manufacture for a differential signal tap.

BACKGROUND

Figure 1:
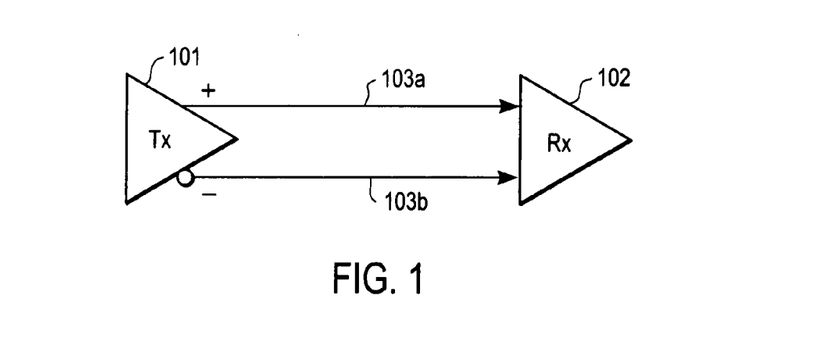
FIG. 1 shows an example of a design for sending and receiving a differential signal.
Figure 2:
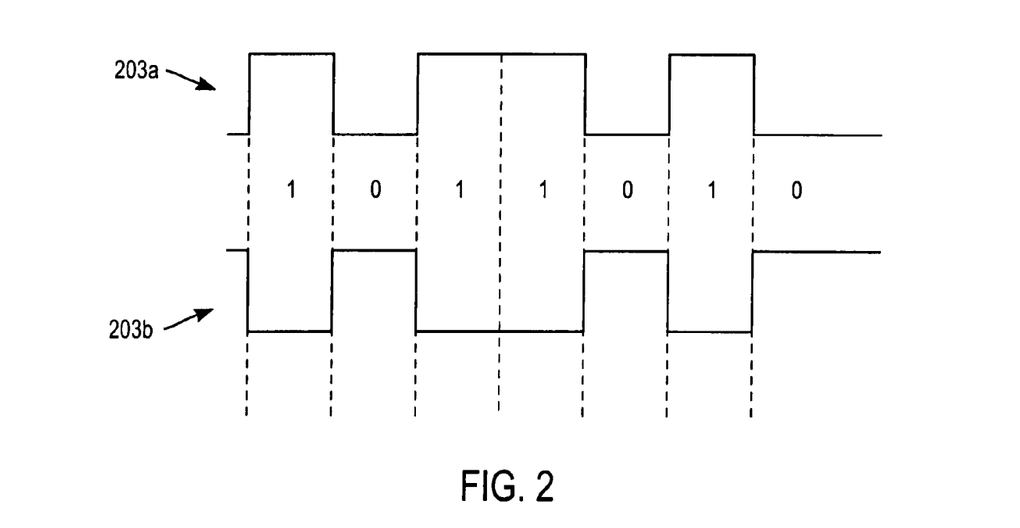
FIG. 2 shows an example of a differential signal.

Differential signals are often used in high speed circuits including those associated with high speed interfaces. A differential signal is a signal that is constructed from a pair of signals: 1) a positive signal (the "+" signal); and, 2) a negative signal (the "−" signal). According to the operation of a differential signal, the − signal is designed to be the inverse of the + signal. FIGS. 1 and 2 demonstrate an example.

FIG. 1 shows a differential transmitter 101 (i.e., a device that transmits a differential signal) that is coupled to a differential receiver 102 (i.e., a device that receives a differential signal). A first signal line 103a is used to propagate the + signal (and may therefore be referred to as the + signal line 103a); and, a second signal line 103b is used to propagate the − signal (and may therefore be referred to as the − signal line 103b). Hence, the pair of signals are transported on a pair of signal lines 103a, 103b. The pair of signal lines 103a, 103b may be referred to collectively as a differential channel.

FIG. 2 demonstrates an example of the inverse relationship between a logical + signal and a logical − signal. Recalling that the − signal is designed to be the inverse of the + signal, note that the − signal 203b of FIG. 2 is the logical inverse of the + signal 203a of FIG. 2. That is, where the voltage level of the + signal 203a is a "1", the voltage level of the − signal 203b is a "0"; and, likewise, where the voltage level of the + signal 203a is a "0", the voltage level of the − signal 203b is a "1".

Figure 3:
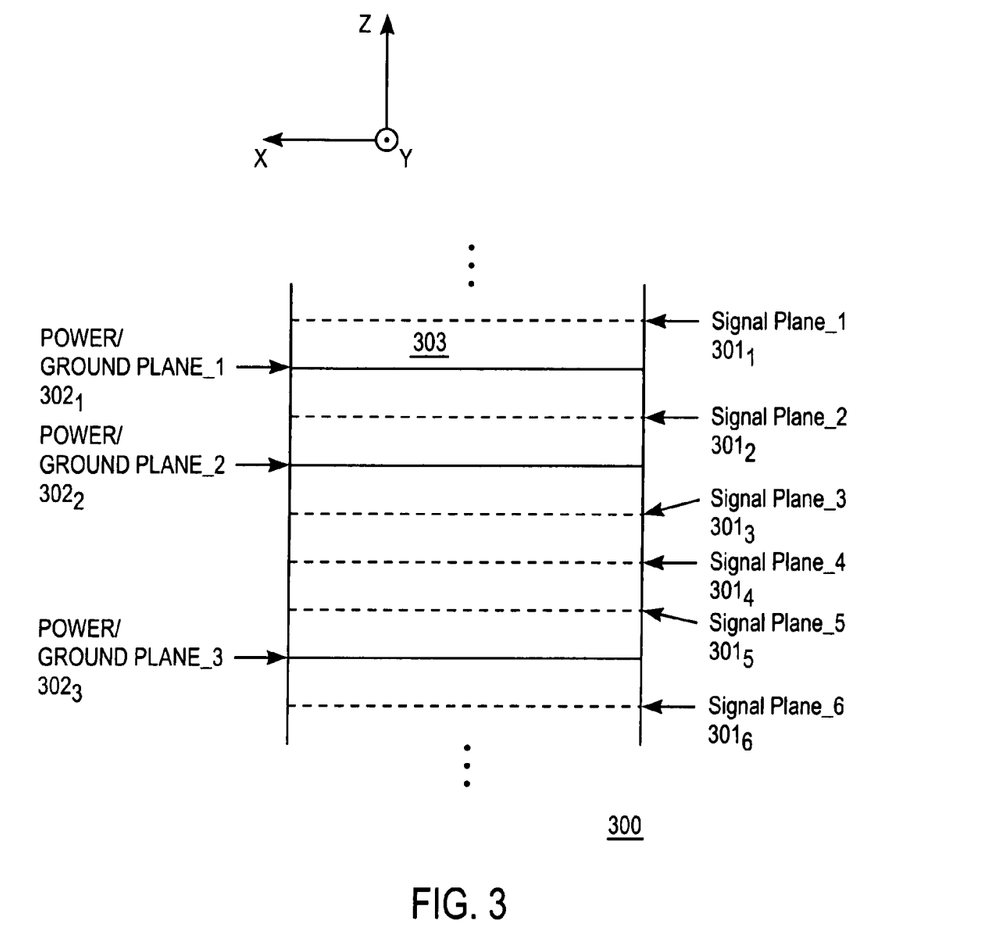
FIG. 3 shows an example of a cross section of a planar board section.

FIG. 3 shows a depiction of a cross section 300 of a section of a planar board. Planar boards (which are also referred to as PC boards, PCBs, and the like) are used in a wealth of electronic products such as computing systems (e.g., laptops, personal computers, servers, workstations, etc.), networking systems (e.g., routers, bridges, switches, gateways, etc.), handheld devices (e.g., cellphones, personal digital assistants (PDAs), etc.) and test and/or measurement equipment. Planar boards are used to provide the signal lines that exist between a plurality of separate electronic components (e.g., discrete semiconductor chips, discrete capacitors, discrete resistors, etc.).

Typically, the separate electronic components are mounted to at least one side of the board (e.g., the "top side" and/or "bottom side" of the board). The inputs and/or outputs of these components (which are commonly referred to collectively as "I/Os") are usually implemented as leads, balls, pins, etc. The I/Os are electrically coupled to one or more conducting regions that have been fabricated into the planar board. Thus (for example) if multiple semiconductor chips are mounted to the same planar board, the semiconductor chips can send a signal between each other via a conducting region that has been built into the board.

According to the planar board cross section 300 of FIG. 3, the board can be viewed as a multilayer structure having "signal" layers and "power/ground" layers. Note that the signal layers may also be referred to as signal planes $301_1$ through $301_6$; and, the power/ground layers may also be referred to as power/ground planes $302_1$ through $302_3$. Typically, the conducting regions used for propagating electrical signals reside along one or more of the signal planes $301_1$ through $301_6$. Each of the power/ground planes $302_1$ through $302_3$ are typically used for providing a reference voltage such as a ground reference or a Direct Current (DC) power supply voltage (e.g., 5v, 3.3v, 2.5v).

Thus, typically (although not a strict requirement), most of the conducting regions that reside along a signal plane resemble a collection of thin conducting strips (e.g., akin to wiring) whereas most of the conducting regions that reside within the power/ground planes resemble a wider planar region. Conducting strips are used to implement a signal line. In practice, a conducting strip often resembles a wire (e.g., having a substantially longer length than width) with a rectangular cross-section.

Usually, the planar board is constructed such that "neighboring" planes (e.g., signal plane $301_1$ and power/ground plane $302_1$) are separated by a dielectric material (e.g., located at region 303 of FIG. 3). The number of signal layers that reside between a pair of power/ground planes may vary from board to board (as well as vary within the confines of a single board as suggested by FIG. 3). The number of layers per board may also vary from board to board. It is also possible to design a planar board such that some power or ground references are supplied along a signal plane and/or some signals are transported along a power/ground plane.

BRIEF DESCRIPTION OF THE DRAWINGS

FIG. 7 shows an example of a layout for terminating the + and − tap signal lines of FIG. 5a.

DETAILED DESCRIPTION

A problem with high speed differential signals (e.g., because they involve a pair of signals lines and are often used with high speed signals) is that they are difficult to "tap". A tap is a signal line that collects at least some of the signal energy from another signal line. For example, in testing environments, a tap may be used to monitor the signal quality on a particular signal line. In normal operating environments, as another example, a tap may be used so that a signal can be driven to a pair of destinations (rather than a single destination).

Figure 4A:
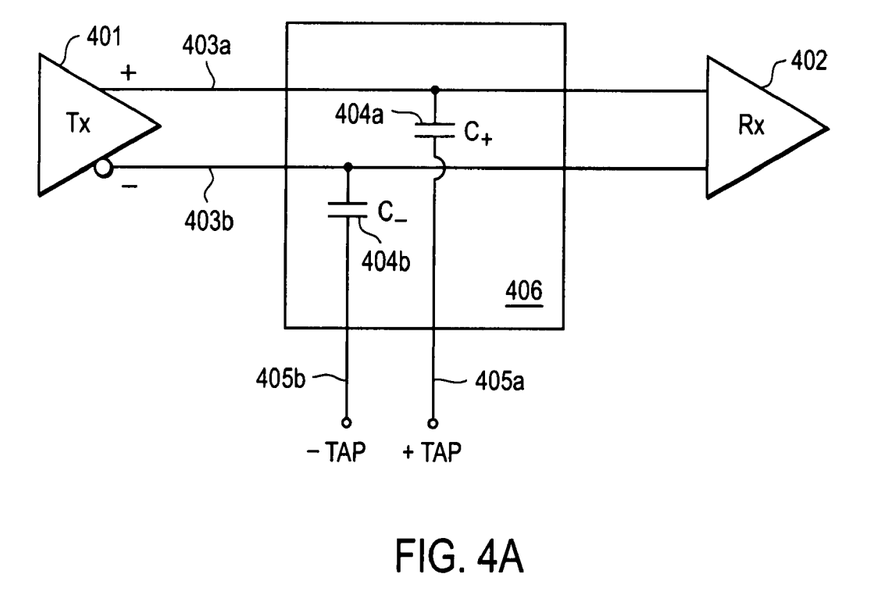
FIG. 4a shows an example of a differential signal tapping scheme that employs capacitive coupling.

FIG. 4a shows an example of a capacitive coupling technique for tapping a differential signal. According to the approach of FIG. 4a, at least some of the signal energy on the + signal line 403a will appear at the + tap 405a; and, at least some of the signal energy on the − signal line 403b will appear at the − tap 405b. As such, the waveforms appearing at taps 405a, 405b will correspond to a "tapped" version of the differential signal that is driven onto signal lines 403a, 403b by the differential transmitter 401 (and received by the differential receiver 402).

The tapping technique of FIG. 4a is referred to as capacitive coupling because a pair of capacitors C+ 404a, C− 404b are used to implement the mechanism for "tapping" the + and − signal lines 403a, 403b. That is, as is known in the art, a capacitor impedes the propagation of a signal (through the capacitor) according to:

$$Xc=1/(j2\pi fC)$$

where C is the capacitance of the capacitor and f is the frequency of the signal component being transferred.

Thus, the higher the C+ capacitance 404a is designed to be and/or the greater the frequencies of the signal propagating along the + signal line 403a are designed to be, the more the C+ capacitor 404a will act as a short circuit (allowing for an easier transfer of the signal that appears on the + signal line 403a to the + tap 405a). Similarly, the higher the C− capacitance 404b is designed to be and/or the greater the frequencies of the signal propagating along the − signal line 403b are designed to be, the more the C− capacitor 404b will act as a short circuit (allowing for an easier transfer of the signal that appears on the − signal line 403b to the − tap 405b).

Those of ordinary skill can determine a proper amount of capacitance for the C+, C− capacitors 404a, 405a (in light of the frequencies that are expected to be associated with the signaling on the + and − signal lines 403a, 403b) so that the + and − taps 405a, 405b provide acceptable + and − tapped signals for the application at hand, respectively. A matter of increasing concern, however, is the impedance of the + and − signal lines 403a, 403b. The impedance of the + and − signal lines 403a, 403b characterizes their ability to transport an electromagnetic wave. Generally, the sending of a signal from the transmitter 401 to the receiver 402 is accomplished by the sending of an electromagnetic wave from the transmitter 401 to the receiver 402.

According to standard electromagnetic wave theory, a change in the transportation medium of an electromagnetic wave causes a reflection of that wave. As the impedance of the + and − signal lines 403a, 403b effectively characterizes their ability to transport an electromagnetic wave, a change in the impedance of the + and − lines 403a, 403b (e.g., wherein a first region of the signal lines 403a, 403b have a first impedance and a second region of the signal lines 403a, 403b have a second impedance) corresponds to a change in the transportation medium for an electromagnetic wave that is sent by the transmitter 401 to the receiver 402.

As such, a change in the impedance of the + and − signal lines 403a, 403b will cause a reflection of a signal that is sent from the transmitter 401 to the receiver 402. Generally, as signaling frequencies increase, signaling reflections become more akin to interference which can cause distortion(s) in the shape of the signals that appear on the signal lines 403a, 403b. If signaling shape is distorted, as an example of one effect, the receiver 402 can misinterpret the information being sent by the transmitter 401 (e.g., by misinterpreting a "1" as a "0"; or, by misinterpreting a "0" as a "1").

Thus, as signaling frequencies of semiconductor devices generally increase with each new generation of semiconductor manufacturing technology (e.g., as measured by reduced gate-length), the impedance of the + and − signal lines 403a, 403b becomes an increasingly important aspect of the design for a differential signaling scheme. Specifically, in order to avoid misinterpretations at the receiver 402, the impedance of the signal lines are specially tailored by the designer so as to keep the ill-effects of signal reflections manageable.

Signaling reflections (and the ill-effects that arise from them) can be reduced if the impedance of the + and − signal lines 403a, 403b remain unchanged over their length from transmitter 401 to receiver 402. This poses a problem in the region 406 of the + and − signal lines 403a, 403b where the capacitive coupling is performed (via the C+ and C− capacitances 404a, 404b) for tapping purposes.

Figure 4B:
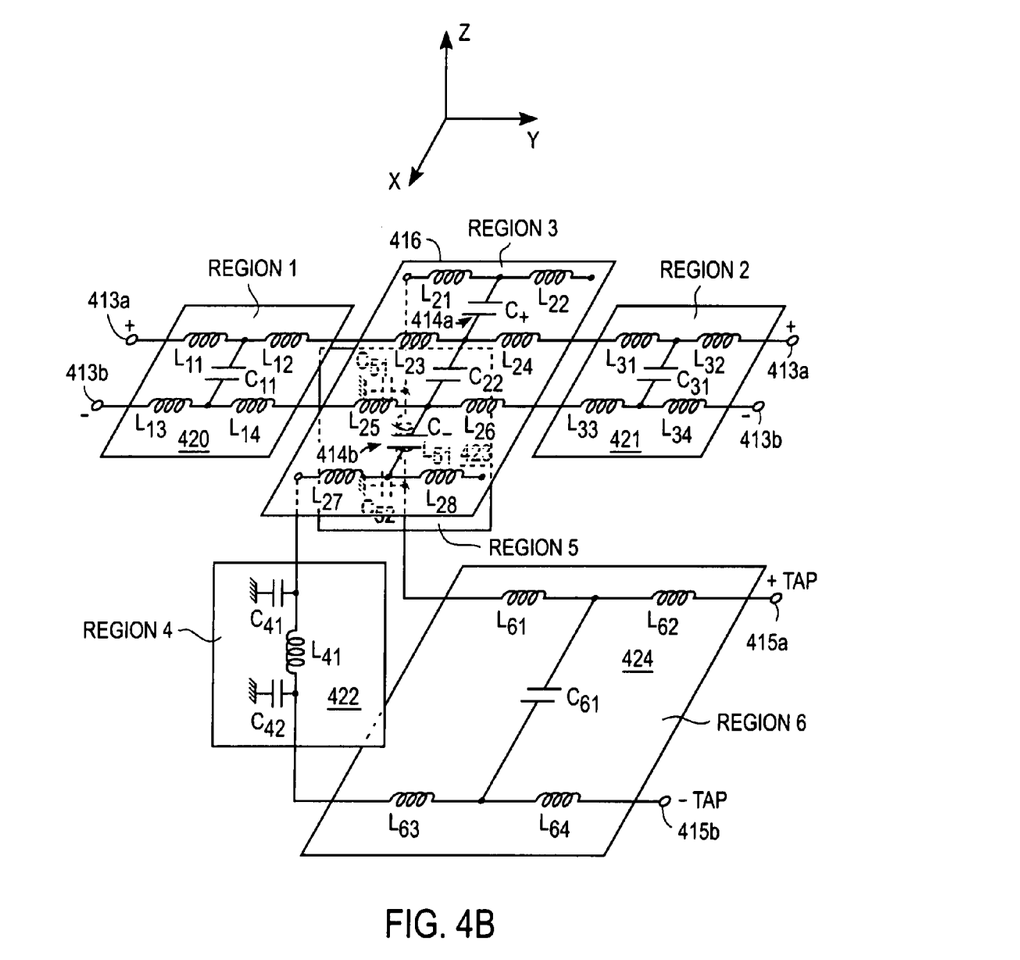
FIG. 4b shows an example of an equivalent circuit for a differential signal tapping scheme that employs capacitive coupling.
Figure 5A:
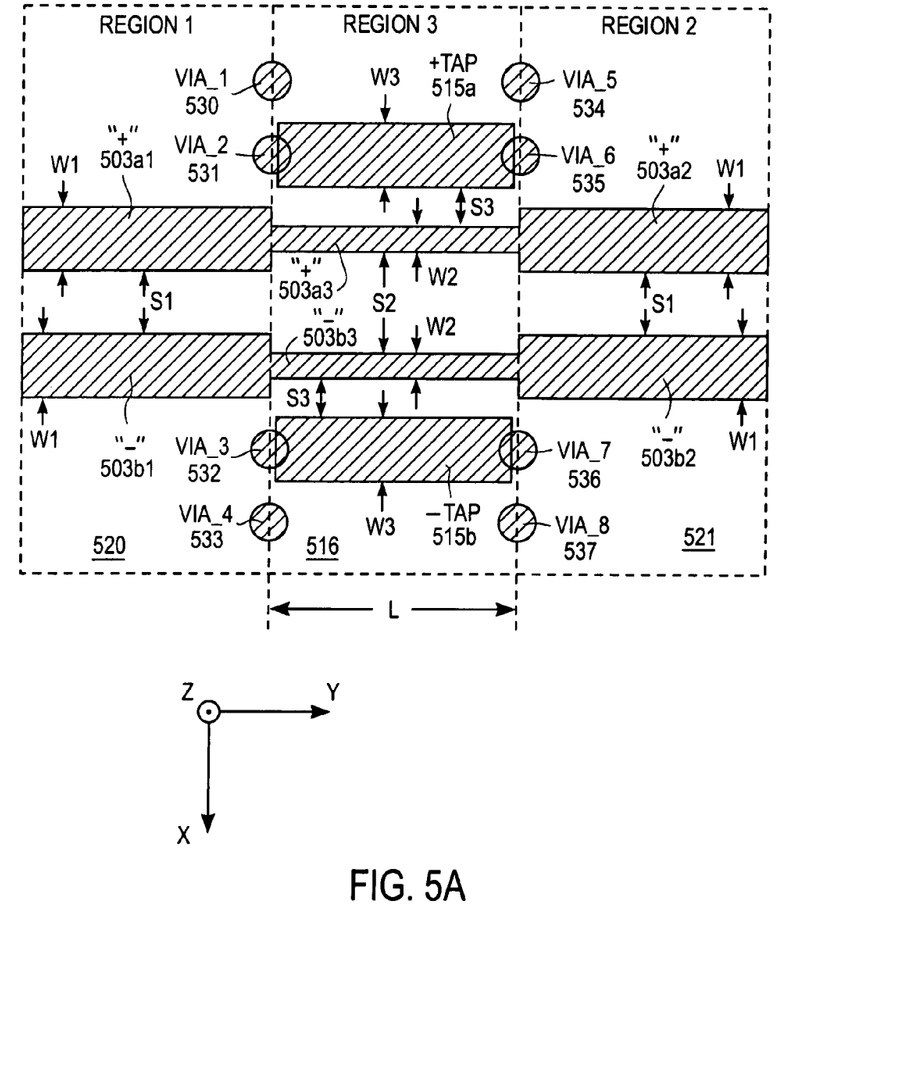
FIG. 5a shows an example of a layout for the differential signal tapping scheme observed in FIG. 4b.

Specifically, unless appropriate design precautions are taken, the introduction of the C+ and C− capacitances 404a, 404b will introduce changes to the impedance of the + and − signal lines 403a, 403b. FIGS. 4b and 5 relate to an embodiment of a design approach that can be used to provide for an adequate tap of a differential signaling scheme; while, at the same time, limit the impedance change of the + and − signal lines 403a, 403b (as caused by the C+ and C− capacitances) so that the ill-effects of signal reflections are kept within a manageable realm.

FIG. 4b shows an equivalent circuit and FIG. 5a shows a layout of the conducting traces that can be formed within a planar board environment according to the embodiment of the design approach discussed herein. Here, FIG. 4b shows the + and − signal lines each spanning across planar regions 420, 416 and 421; and, FIG. 5a shows the corresponding + and − signal lines each spanning across planar regions 520, 516 and 521. As such, recalling the background discussion of planar board technology that referred to FIG. 3, planar regions 420, 416, and 421 of FIG. 4b may each be viewed as lying within the same signal plane of a planar board; and, planar regions 520, 516, and 521 may each be viewed as lying within the same signal plane of a planar board.

This is consistent with the coordinate systems that have been provided in FIGS. 4b and 5. That is, each of the planar regions that are associated with the + and − signal lines of FIGS. 4b and 5 (i.e., planar regions 420, 416 and 421 of FIG. 4b and planar regions 520, 516, and 521 of FIG. 5a) lie in the same xy plane. FIG. 5a is drawn so that the viewer looks down in the −z direction upon the + and − signal line conducting strips while FIG. 4b is drawn approximately along a <−1, −1, −1> unit vector so that a three dimensional effect can be appreciated.

With regard to the depictions of FIGS. 4b and 5, the "length" of the + and − signal lines is measured along the y axis. Thus, the + signal line 413a of FIG. 4b includes inductances per unit length of $L_{11}$, $L_{12}$, $L_{23}$, $L_{24}$, $L_{31}$, and $L_{32}$; and, the − signal line 413b of FIG. 4b includes inductances per unit length of $L_{13}$, $L_{14}$, $L_{25}$, $L_{26}$, $L_{33}$, and $L_{34}$. Note also that the + and − signal lines 413a, 413b of FIG. 4b are capacitively coupled by capacitances per unit length of $C_{11}$, $C_{22}$, and $C_{31}$. The C+ and C− tapping capacitances 414a, 414b are observed in the third planar region 416. In FIG. 5a, the + signal conducting strip is drawn as a continuous strip formed by strip sections 503a1, 503a3 and 503a2. Similarly, the − signal conducting strip is drawn as a continuous strip formed by strip sections 503b1, 503b3 and 503b2. Note also that an electrode for the C+ tapping capacitance is drawn as conducting strip 515a; and an electrode for the C− tapping capacitance is drawn as conducting strip 515b.

The equivalent circuits observed in each of planar regions 420, 416, 421 of FIG. 4b can be viewed as corresponding, respectively, to the conducting strip layouts observed in planar regions 520, 516, 521 of FIG. 5a. That is, the equivalent circuit observed within planar region 420 of FIG. 4b may be viewed as the equivalent circuit for the conducting strip layout observed in planar region 520 of FIG. 5a; the equivalent circuit observed within planar region 416 of FIG. 4b may be viewed as the equivalent circuit for the conducting strip layout observed in planar region 516 of FIG. 5a; and, the equivalent circuit observed within planar region 421 of FIG. 4b may be viewed as the equivalent circuit for the conducting strip layout observed in planar region 521 of FIG. 5a.

As such, note that a conducting strip section (such as conducting strip section 503a1 within planar region 520 of FIG. 5a) has an equivalent circuit that corresponds to a pair of series inductances per unit length (such as inductances $L_{11}$ and $L_{12}$ within planar region 420 of FIG. 4b) and a shunt capacitance per unit length (such as capacitance $C_{11}$) coupled to each parallel neighboring trace (such as trace section 503b1 relative to trace section 503a1 within planar region 520 of FIG. 5a). The inductances per unit length and the capacitance(s) per unit length are a function of the geometry of the layout.

That is, referring to planar regions 420, 520 of FIGS. 4b and 5 as an example, generally, the widths W1 of the conducting strip sections 503a1, 503b1 will help produce a specific inductance per unit length for each strip section; and, the spacing S1 between the conducting strip sections 503a1, 503b1 will help produce a specific capacitance per unit length for the pair of strip sections. Generally, for a pair of conducting strips such as conducting strips 503a1, 503b1: 1) the narrower the width W1 of the strip sections 503a1, 503b1, the greater their inductance per unit length $L_{11}$, $L_{12}$ and $L_{13}$, $L_{14}$; and, 2) the narrower the spacing S1 between the strip sections 503a1, 503b1, the greater their capacitance per unit length $C_{11}$.

Note that for a pair of parallel strip sections of equal width (and thickness), the corresponding inductances per unit length for each strip section (e.g., $L_{11}$ and $L_{13}$) should be approximately the same; and, for strip sections spaced approximately the same distance apart (e.g., wherein spacing S1 is approximately constant over a running length of the strip sections) $C_{11}$ should be approximately constant. Here, length is measured along the y axis, width is measured along the x axis and thickness is measured along the z axis.

One of ordinary skill will appreciate that the impedance of a pair of conducting strip sections (such as the pair of conducting strip sections 503a1, 503b1 observed in planar region 520 of FIG. 5a) varies as $$(L/C)^{1/2} \qquad \text{Eqn. 1}$$

where L is the inductance per unit length and C is the capacitance per unit length (e.g., as described just above). Noting that the inductance per unit length and capacitance per unit length of a pair of conducting strip sections is related to the geometry of the strip sections themselves (e.g., as observed with respect to the relevance of strip width W1 and strip spacing S1), it is worthwhile to note that the impedance of a pair of conducting strip sections is therefore related to conducting strip geometry as well.

Recalling that it is preferrable to keep the impedance approximately constant over the length of the + and − signal lines of a differential channel (in order to keep reflections within a manageable realm); and, realizing that introducing a pair of C+ and C− tapping capacitances 414a, 414b to a differential channel will effectively raise the capacitance per unit length of a pair of conducting strip sections that implement the + and − signal lines of the differential channel (in the region of the + and − signal lines where the tapping capacitances C+, C− are added)—one of ordinary skill should therefore appreciate that the introduction of the C+,C− tapping capacitances 414a, 414b may therefore cause reflection problems along the + and − signal lines if adequate precautions are not undertaken.

For the sake of simplicity, the equivalent circuit shown in FIG. 4b (and FIG. 7 which is discussed in more detail below) neglects the mutual inductances that exist between the conducting strips. The inductance matrix associated with uniform coupled conductor strips in a homogeneous media, as illustrated in Region 3 of FIG. 5a, is not an independent parameter, but can be directly obtained from a capacitance matrix that describes the capacitive coupling between the conducting strips, (more specifically, the inductance matrix is equal to inverse of the capacitance matrix multiplied by a constant). As those of ordinary skill could adequately construct the applicable capacitance matrix in light of the present teachings, it follows that those of ordinary skill could also adequately construct the correct inductance matrix as well.

The coupling between the conducting strips of FIG. 5a is due to both induction and capacitance; but, owing to the inverse relationship between the capacitance and inductance matrix, the functionality of the structure observed in FIG. 5a is best explained in terms of capacitance. It is to be noted, however, that an attempt to simulate the operation of the circuits observed in FIGS. 4b and 7 should include mutual inductance to account for the coupling between the strips through induction. Additionally, the near-end cross-talk (or reverse cross-talk) of uniform coupled conductor strips in a homogeneous media, as illustrated in Region 3 of FIG. 5a, is used to obtain the tap signals.

Continuing then with a discussion of circuit operation, the introduction of the C+ and C− tapping capacitances 414a, 414b to the differential channel will effectively lower the value for L/C in the region where they are introduced if conducting strip geometries are left unaltered (because, the C+ and C− tapping capacitances 414a, 414b effectively increase the value of "C" making "L/C" a smaller number). Accordingly, note from the layout embodiment of FIG. 5a, that the + and − conducting strips 503a3, 503b3, exhibit a changed geometry within planar region 516 (as compared to planar regions 520 and 521).

According to the layout approach of region 516 of FIG. 5a, the impedance of the + and − conducting strip sections 503a3, 503b3 are designed to approximately match that of conducting strips 503a1, 503b1 within region 520. Specifically, because the C+,C− tapping capacitances (which are formed by the addition of conducting strips 515a, 515b) effectively add to the capacitance of the conducting strip sections 503a3, 503b3 within region 516, the conducting strip sections 503a3, 503b3 within region 516 are designed to have a larger L/C value by themselves (i.e., without the consideration of the effects of conducting strips 515a, 515b) than the conducting strip sections 503a1, 503b1 within region 520.

This is evident from FIG. 5a because: 1) the width W2 of the conducting strip sections 503a3, 503b3 within region 516 is narrower than the width W1 of the conducting strip sections 503a1, 503b1 within region 520 (which leads to greater inductances per unit length along the + and − conducting strip sections within region 516 than in region 520); and, 2) the spacing S2 between the conducting strip sections 503a3, 503b3 within region 516 is greater than the spacing S1 between the conducting strip sections 503a1, 503b1 within region 520 (which leads to smaller shunt capacitance between the + and − conducting strip sections per unit length within region 516 than in region 520). As greater L and smaller C corresponds to larger L/C, the conducting strip sections 503a3 and 503b3 within region 516 of FIG. 3 therefore possess larger L/C as compared to their counterpart conducting strip sections 503a1, 503b1 within region 520 when the effects of conducting strips 515a and 515b are ignored.

Here, note that conducting strip section 503a3 acts as a first electrode of the C+ capacitor 414a; and, conducting strip 515a acts as a second electrode of the C+ capacitor 414a (because electric field lines will be established substantially along the x axis over a distance of S3 through the dielectric material that resides between conducting strip region 503a3 and conducting strip 515a). Thus, as seen in FIG. 5a, the conducting strip for the + signal line is narrowed along a section 503a3 where it also acts as an electrode for the C+ capacitor 414a.

Similarly, conducting strip section 503b3 acts as a first electrode of the C− capacitor 414b; and, conducting strip 515b acts as a second electrode of the C− capacitor 414b (because electric field lines will be established substantially along the x axis over a distance of S3 through the dielectric material that resides between the conducting strip region 503b3 and conducting strip 515b). As such, the conducting strip for the − signal line is narrowed along a section 503a3 where it also acts as an electrode for the C− capacitor 414b.

As a result, by themselves, the conducting strip sections 503a3, 503b3 within region 515 have a higher L/C value than the conducting strip sections 503a1, 503b1 within region 520. Thus, when one considers the effect of conducting strips 515a, 515b in region 516, the additional capacitance effectively lowers the L/C value of conducting strip sections 503a3, 503b3 so that the L/C values of the two regions 516, 520 are sufficiently comparable to one another; and, their impedances are brought closer together as a result. As such, reflections induced at the interface between region 520 and 516 can be kept within a manageable realm.

Note also that according to the embodiment of FIG. 5a the conducting strip sections 503a2, 503b2 within region 521 have been designed according to the same dimensions as the conducting strip regions 503a1, 503a1 within region 520. As such, according to the same analysis provided just above, reflections induced at the interface between planar region 516 and 521 are also kept within a manageable realm. Before continuing, it is important to note that quite often some degree of reflections are permissible within a differential channel; and, although having no reflections is often viewed as an ideal condition, typically, it is not feasible or practicable to design an interface that does not have any reflections whatsoever. As such, the claims that follow should not be construed so as to automatically be limited to interfaces that do not induce any reflected energy. Furthermore, those of ordinary skill will be able to determine the appropriate amount of reflection activity that is permissible for their particular energy. Reflection losses of −25 db or less are believed to be obtainable if a high quality differential signal (e.g., high differential symmetry) is maintained.

Appropriate values for S2, S3 and W3 that allow an acceptable amount of coupled energy and that correspond to an appropriate differential impedance can be determined through optimization within a simulation environment (e.g., through use of MOMENTUM™ software offered by Agilent Technologies™). Along this line of thought, note that the length L of Region 3 in FIG. 5a depends upon the desired lower and upper frequency bounds of the signal(s) that the tapping structure is to process. As a rule of thumb, L should be designed near or equal to $\lambda_{min}/4$ where $\lambda_{min}$ is the wavelength of the lower frequency bound for the input data signal.

Referring to the embodiment of FIG. 4b, note that the tapped signal nodes (+ tap 415a and − tap 415b) "drop" down to another, lower signal plane. That is, the planar region 424 (which includes the tapped signal nodes 415a, 415b) lays in another xy plane that is beneath the xy plane within which planar regions 420, 416 and 421 lay. As such, in a planar board environment, the tapped signal nodes 415a, 415b can be viewed as laying in a different signal plane than the signal plane within which the + and − signal lines 413a, 413b of the differential signal layer.

Note that a pair of conducting strips can be used to propagate the tapped signals along planar region 424 (as supported by the equivalent circuit drawn in FIG. 4b). Vias can be used to connect the tapped signal lines from the tapping point in region 416 to the conducting strips sections in region 424. Vias are vertical conducting channels (e.g., conducting channels whose signals travel along the z axis as drawn in FIGS. 4b and 5). Vias are most often used to enable a signal line to traverse across different signal planes.

The vias may be implemented such that each via that is used to carry a tapped signal is located proximate to another via that has been "stitched" to a power/ground plane. As a result the via is implemented as a controlled impedance transmission line which allows for better propagation of the tapped signal through the via. Each of FIGS. 4b, 5 and 6 may be viewed as corresponding to such an approach. Firstly, referring to FIGS. 5 and 6, note that the via structure observed in FIG. 6 has been drawn so as to correspond to an embodiment of the manner in which the seventh and eighth vias Via_7 536, and Via_8 537 of FIG. 5a may be configured.

Figure 6:
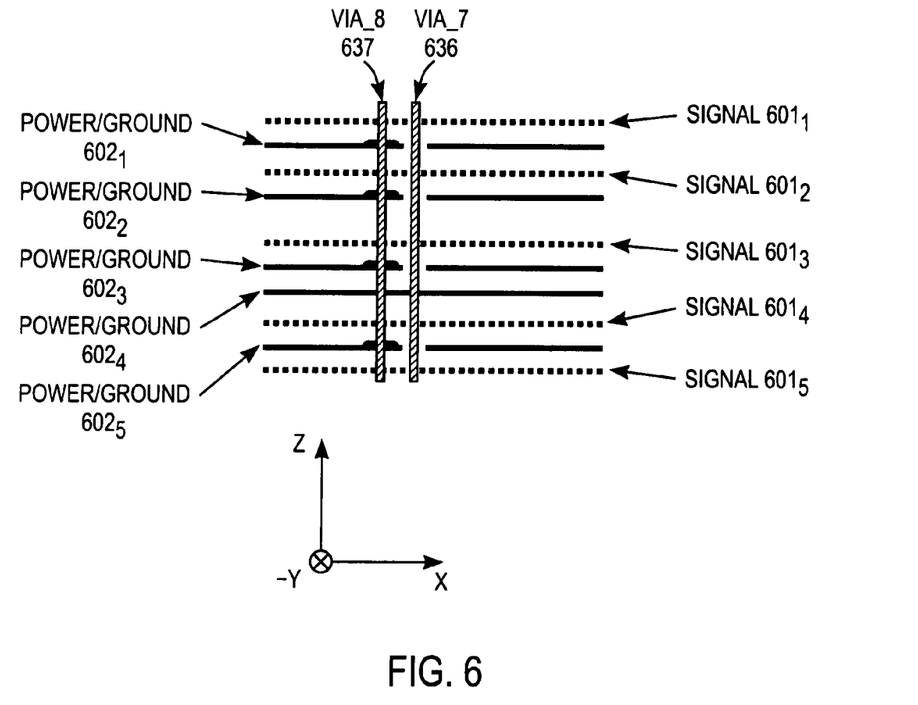
FIG. 6 shows a depiction as to how the vias that help the tapping of the + signal conducting strip of FIGS. 4b and 5 may be implemented.

That is via_7 636 of FIG. 6 may be viewed as corresponding to via_7 536 of FIG. 5a; and, via_8 637 of FIG. 6 may be viewed as corresponding to via_8 537 of FIG. 5a. Note that, according to the coordinate systems drawn in FIGS. 5 and 6, FIG. 5a is a "top" view of the vias 536, 537 that looks "down" into the −z direction and FIG. 6 is "cross section" that looks at the vias in the −y direction. Here, via_7 536, 636 (being electrically coupled to the conducting strip 515b which forms an electrode of the C− tapping capacitance) is used to vertically propagate the tapped − signal.

Via_8 537, 637 is "stitched" to the power/ground planes $602_1$ through $602_5$. That is, as seen in FIG. 6, via_8 537, 637 is electrically connected to at least one power/ground plane that it travels through. Note that via_8 should be stitched to power/ground planes of a common reference voltage (i.e., only the ground planes; or, only the 3.3v planes) so that reference voltages are not inadvertently shorted to one another. By placing a via that is stitched to a power or ground plane (such as via_8 537, 637) proximate to a via that is used to transport a signal (such as via_7 536, 636), the signal is propagated with less attenuation because the pair of vias 536 and 537, 636 and 637 effectively form a controlled impedance transmission line (as suggested by the equivalent circuit drawn in region 422 of FIG. 4b).

Once the via is dropped to the appropriate signal plane where the tapped signals are to be further propagated along, the conducting strips that reside within the appropriate signal plane may be designed as a stripline pair similar to those observed in regions 520 and 521 of FIG. 5a. Note that another pair of vias 534, 535 may be used to drop the other tapped signal. Here, Via_6 535 corresponds to the via that transports the tapped signal from the + signal line and Via_5 534 corresponds to the "stitched" via that helps form a controlled impedance transmission line.

Figure 7:
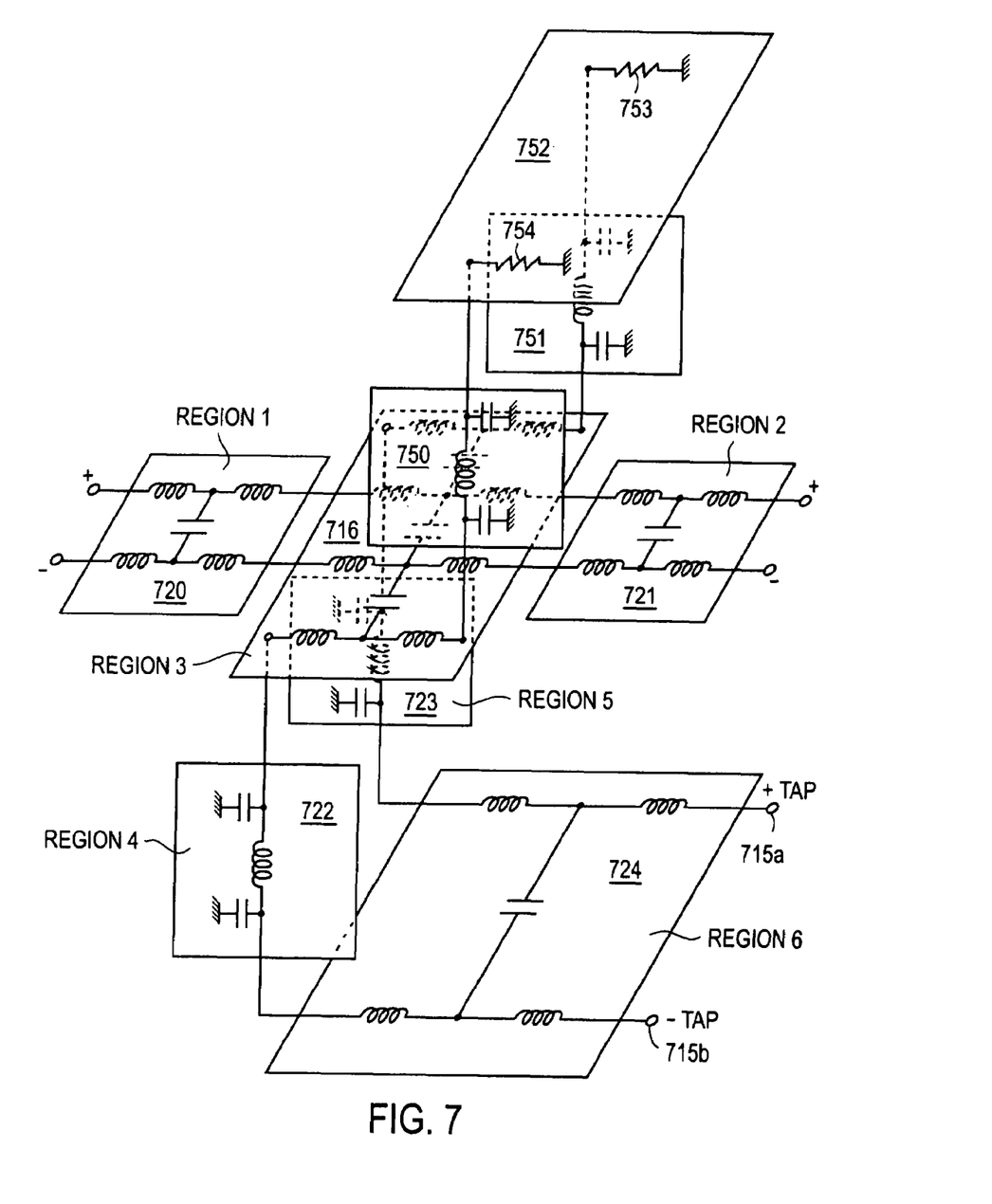

FIG. 7 shows an embodiment of an equivalent circuit where the + and – tap signal lines 715a, 715b further include a termination resistance. Here, termination resistance 753 is used to terminate the + tap signal line 715a and termination resistance 754 is used to terminate the – tap signal line 715b. Termination resistances, as is known in the art, can be used to reduce signal reflection energy on their corresponding signal lines. Hence, termination resistance 753 helps reduce + tapped signal reflections on the + tap signal line 715a; and termination resistance 754 helps reduce – tapped signal reflections on the – tap signal line 715b. In many applications, the resistive value of the termination resistance should be one half that of the differential impedance of the port from where the tapped signal is tapped.

As termination resistances are often implemented as surface mount components, planar region 752 can be viewed, in one embodiment, as a surface of a planar board. As such, vias may be incorporated into the layout that couple the planar board surface to each tapping capacitance electrode that resides on the tapped signal line side of a tapping capacitance. That is, for example, a via structure associated with the equivalent circuit observed in region 751 of FIG. 7 can be configured to run (in the + z direction) from electrode 515a of FIG. 5a; and, a via structure associated with the equivalent circuit observed in region 750 of FIG. 7 can be configured to run (in the + z direction) from electrode 515b of FIG. 5a.

Note that the via structures mentioned above may each be constructed with a pair of vias where a first via acts as the signal trace and a second via is coupled to a reference voltage (as described with respect to FIG. 6). Note also that FIG. 5a illustrates such an approach where: 1) Via_1 530 can be used as the via that is stitched to reference voltage and Via_2 531 can be used to couple electrode 515a to the planar board surface; and, 2) Via_3 532 can be used to couple electrode 515b to the planar board surface and Via_4 533 can be used as the via that is stitched to a reference voltage plane.

Those of ordinary skill in the field of planar board manufacturing will be able to manufacture a planar board having a differential signal tapping structure such as those described above. Typically, lithography techniques are used so that images of the desired conducting region features of a planar board plane (e.g., images of specific conducting strips) can be focused onto a planar board plane; and wherein these images are used to develop the desired conducting regions. Furthermore, those of ordinary skill in the field of systems manufacturing will be able to integrate a planar board having a differential tapping structure as described such as those described above as part of a computing system, networking system or handheld device.

Figure 5B:
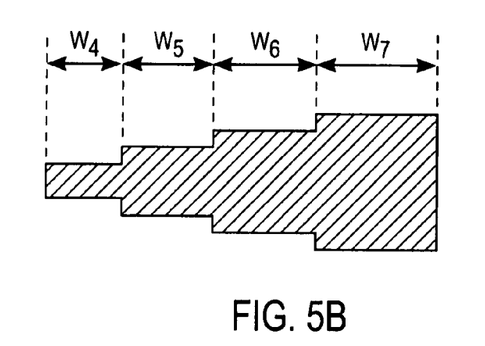
FIG. 5b shows a stepped "impedance transformer" conductive strip.
Figure 5C:
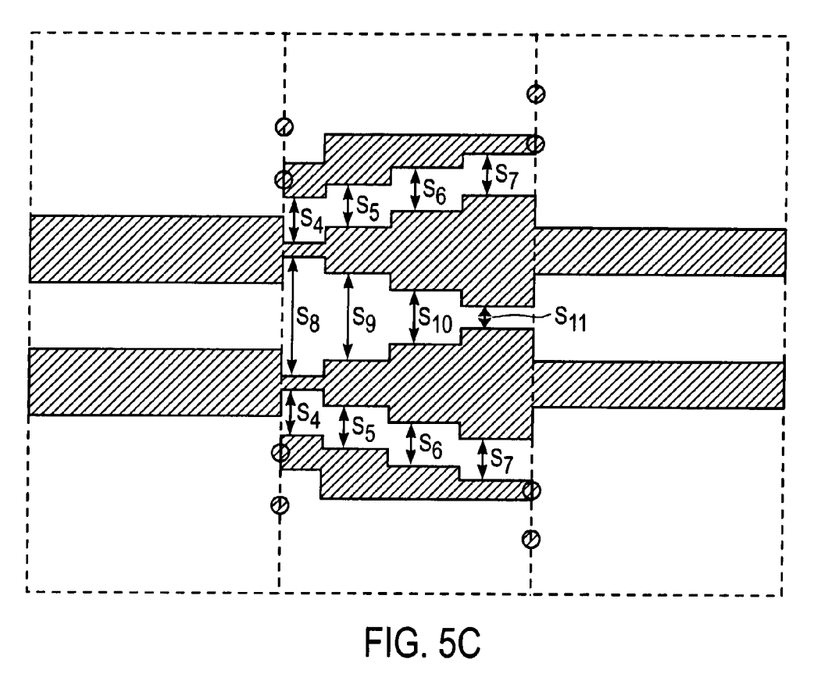
FIG. 5c shows the differential tapping scheme of FIG. 5a modified to include stepped "impedance transformer" conductive strips.

FIGS. 5b and 5c relate to an alternate embodiment that may be particularly useful wide band data signals. A strip format referred to as a "stepped impedance transformer" and used for impedance transformations (and which has been widely used in microwave applications) is presented in FIG. 5b. The "stepped impedance transformer" can be applied to the proposed structure of FIG. 5a as shown in FIG. 5c. In the structure of FIG. 5c, in order to introduce the "stepped" strip format of FIG. 5b, Region 3 is subdivided into cascaded sections of progressively wider coupled lines. Note that each of the tapping capacitance electrodes is similarly stepped in parallel with its corresponding stepped impedance transformer conducting strip along the edge that faces its corresponding stepped impedance transformer strip. Again, a planar EM tool coupled with optimization such as MOMENTUM can be used to optimize the dimensions of the structure (e.g., W4 through W7 and S4 through S11) to obtain a tapped signal at the taps with desired wide-band characteristics.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
   a) a first conducting strip having a narrowed width where said first conducting strip also acts as a first electrode for a first tapping capacitance, said first tapping capacitance having a second electrode that is parallel to said first conducting strip; and
   b) a second conducting strip, said second conducting strip parallel to said first conducting strip, said second conducting strip having a narrowed width where said second conducting strip also acts as a first electrode for a second tapping capacitance, said second tapping capacitance having a second electrode that is:
   1) parallel to said second conducting strip and
   2) closer to said second conducting strip than said first conducting strip, wherein, said second electrode of said first tapping capacitance is closer to said first conducting strip and wherein a first impedance of said narrowed width regions of said first and second conducting strips approximately matches a second impedance of non narrowed width regions of said first and second conducting strips than said second conducting strip.

2. The apparatus of claim 1 wherein said pair of conducting strips are part of a planar board.

3. The apparatus of claim 2 wherein said planar board is part of a computing system.

4. The apparatus of claim 2 wherein said planar board is part of a networking system.

5. The apparatus of claim 2 wherein said planar board is part of a handheld device.

6. The apparatus of claim 2 wherein said planar board is part of a test and/or measurement system.

7. The apparatus of claim 2 wherein said second electrode of said first tapping capacitance electrode is coupled to a via, said via running to a different signal plane than the signal plane where said second electrode of said first tapping capacitance is formed.

8. The apparatus of claim 7 further comprising a second via that runs parallel to said first via, said second via coupled to a ground plane.

9. The apparatus of claim 7 further comprising a second via that runs parallel to said first via, said second via coupled to a power supply voltage plane.

10. The apparatus of claim 1 wherein those regions of said first and second conducting strips having said narrowed width reside at least partially in parallel to one another.

11. The apparatus of claim 10 wherein said pair of conducting strips have an increased spacing between one another where said first and second conducting strip widths have been narrowed.

12. The apparatus of claim 1 wherein said conducting strips have a reflection loss of −25 dB or less.

13. The apparatus of claim 1 wherein said narrowed width of said first conducting strip is designed to be the same as said narrowed width of said second conducting strip.

14. The apparatus of claim 1 wherein said first and second conducting strips are part of a differential channel.

15. The apparatus of claim 1 further comprising:

a first via that is coupled to said second electrode of said first tapping capacitance, said first via running to a different signal plane that the signal plane where said second electrode of said first tapping capacitance resides;

a second via that is coupled to said second electrode of said second tapping capacitance, said second via running to said different signal plane;

a third via that runs parallel to said first via and is closer to said first via than said second via, said third via coupled to a first voltage reference plane;

a fourth via that runs parallel to said second via and is closer to said second via than said first via, said fourth via coupled to a second reference voltage plane.

16. The apparatus of claim 1 wherein the lengths of said first tapping capacitance's respective electrodes are substantially the same and wherein the lengths of said second tapping capacitance's respective electrodes are substantially the same.

* * * * *